United States Patent [19]
Magazzu' et al.

[11] Patent Number: 5,982,209
[45] Date of Patent: Nov. 9, 1999

[54] CLOCK CIRCUIT AND CORRESPONDING METHOD FOR GENERATING AND SUPPLYING A CLOCK SIGNAL TO ELECTRONIC DEVICES

[75] Inventors: Antonio Magazzu', Catania; Bruno Ferrario, Fino Mornasco, both of Italy

[73] Assignee: SGS-Thomson Microelectronics S.r.l., Agrate Brianza, Italy

[21] Appl. No.: 08/899,248

[22] Filed: Jul. 23, 1997

[30] Foreign Application Priority Data

Jul. 24, 1996 [EP] European Pat. Off. ............ 96830412

[51] Int. Cl.[6] ............................................. H03L 7/00
[52] U.S. Cl. ............................................ 327/144; 327/291
[58] Field of Search ........................... 327/99, 141, 144, 327/291, 292

[56] References Cited

U.S. PATENT DOCUMENTS

| | | | |
|---|---|---|---|
| 4,598,257 | 7/1986 | Southard | 331/2 |
| 4,972,442 | 11/1990 | Stelerman | 375/357 |
| 4,982,116 | 1/1991 | Lee | 327/99 |
| 5,153,824 | 10/1992 | Lalanne et al. | 364/184 |
| 5,291,070 | 3/1994 | Witt | 327/141 |
| 5,373,254 | 12/1994 | Nakauchi et al. | 331/1 A |

FOREIGN PATENT DOCUMENTS

A-0 517 431 12/1992 European Pat. Off. .

*Primary Examiner*—Kenneth B. Wells
*Attorney, Agent, or Firm*—Wolf, Greenfield & Sacks, P.C.

[57] ABSTRACT

A synchronization circuit for electronic devices and components, being of the type which includes an internal synchronization signal generator and an input/output terminal whereat an external synchronization signal can be received. The synchronization circuit further includes a comparator for receiving both synchronization signals and having a control output for supplying a terminal with the signal corresponding to the master/slave mode of operation of the synchronization circuit. A method of generating and supplying a synchronization signal to a plurality of electronic devices being operated as slave devices to a synchronization circuit acting as the master device is also provided.

19 Claims, 3 Drawing Sheets

५,९८२,२०९

CLOCK CIRCUIT AND CORRESPONDING METHOD FOR GENERATING AND SUPPLYING A CLOCK SIGNAL TO ELECTRONIC DEVICES

BACKGROUND OF THE INVENTION

1. Field of the Invention

This invention relates in general to a synchronization circuit for electronic devices and components and more specifically to a synchronization circuit capable of operating in a master and a slave mode. One embodiment of the invention relates to a synchronization circuit for electronic devices and components, the circuit being of the type which comprises an internal synchronization signal generator and an input/output terminal whereat an external synchronization signal can be received, or the internal synchronization signal can be supplied from the circuit.

Another embodiment of the invention also concerns a method of generating and supplying a synchronization signal to a plurality of electronic devices being operated as slave devices to a synchronization circuit acting as the master device, and wherein the synchronization circuit can, in turn, be operated in the slave mode to receive an external synchronization signal.

2. Discussion of the Related Art

Many applications require in the electronic industry that a number of electronic devices from the same circuit family, or from families of some different type, be rendered compatible with one another. This means that the devices should be capable of operating at the same working frequency to avoid the occurrence of intermodulation phenomena.

This requirement is usually met by using a special synchronization circuit which enables one of the devices to act as the master device, while the other active devices operate in the slave mode.

In essence, one of the devices—referred to as the master—functions as a synchronization circuit and impresses a synchronization signal clock which is picked up by all the slave devices to time their synchronization signals.

A good synchronization circuit should be able to receive or supply the synchronization signal at/to a single output node, but should not form its synchronization signal at that node when operated in the slave mode.

One known synchronization circuit is shown in FIG. 1. In the example of FIG. 1, a synchronization circuit 10 includes a squaring or clipping circuit 11 connected after an oscillator 12. An input terminal IN of the oscillator 12 is supplied an enable signal OSC which is also supplied in parallel to the input of an ON/OFF switch 13. The ON/OFF switch 13 has an output which is coupled to activate the oscillator 12. The switch 13 can be regarded as being part of the synchronization circuit 10.

The clipper 11 is effective to clip the saw-toothed signal output by the oscillator 12. The output of the clipper 11 is connected to a circuit node U supplying a synchronization signal SINC to other circuit components, which are generally designated 14 and internal to the circuit 10.

The synchronization circuit 10 may be operated in a master mode. In master mode, the circuit 10 may supply the signal SINC to electronic devices connected to the terminal A. Alternatively, the circuit 10 may be operated in slave mode, whereby the signal SINC is received at the node U over a connection 15 from the terminal A connected to the output of another master device, not shown in the figure.

In other words, when operating in slave mode, no saw-toothed signal is generated, and the synchronization signal SINC is delivered from outside, i.e. from the terminal A.

The input terminal IN is utilized for controlling the master or slave mode of the synchronization circuit, where a capacitor or a resistor is connected toward ground outside the oscillator. Both the capacitor and the resistor would normally be provided to form an RC circuit.

The known synchronization circuit of FIG. 1 has, however, the following drawbacks. First, a second terminal must be made available for controlling the synchronization circuit. In addition, because the saw-toothed signal is not generated when operating in the slave mode the circuit 10 cannot be used in many applications to which that signal is essential, including Pulse Width Modulators.

A second prior art synchronization circuit is illustrated in FIG. 2 wherein the components already mentioned in connection with FIG. 1 are denoted by the same reference numerals.

The circuit of FIG. 2 can be implemented without a control terminal because the saw-toothed signal from the oscillator is controlled through the synchronization signal SINC alone. In fact, upon detection of the synchronization signal, the saw-toothed signal will be forced to discharge. The receipt of the first input the synchronization signal will also force the outputting of its synchronization signal at node U, as generated by the clipper 11, after a predetermined time delay Td, where the time delay Td is due to the delays of the oscillator 12 and the clipper 11. One problem associated with the circuit of FIG. 2 is that when the two synchronization signals have equal duration, the delay Td of the slave synchronization circuit will cause the synchronization signal to expand, thereby lowering the oscillation frequency. In addition, consumption is bound to increase due to the master circuit clipper tending to force the terminal to discharge, but meeting the opposition of the clipper incorporated to the slave which can deliver a larger current than the master can accept.

If the duration of the synchronization signal of the slave is longer than that of the master, the frequency is further reduced and consumption increased accordingly. Where several devices are to be synchronized, these problems become more serious as a result of the propagation delays introduced by the length of the layout connections.

Plots illustrating the status of the SINC signals versus time are shown in FIGS. 3A and 3B, where FIG. 3A illustrates an ideal synchronization and FIG. 3B illustrates a real synchronization. In FIGS. 3A and 3B, SINC is the synchronization signal, and I (SINC) is the current flowing through the terminal to which the signal SINC is applied.

An additional problem with the circuit of FIG. 2 is that if the synchronization pulse is a very short one, it may be depleted by the time the slave synchronization signal arrives. In this case, the slave would turn into master and force a synchronization signal to the real master, causing the signal to bounce from one circuit to another and the system oscillation frequency to rise until the inverse of the propagation time Td. This phenomenon is illustrated in FIG. 4, which shows the pattern of a synchronization signal whose period is equal to Td.

It would be desirable to provide a synchronization circuit and synchronization method which have such constructional and functional features that would overcome the limitations and drawbacks mentioned above in connection with the background art.

SUMMARY OF THE INVENTION

The present invention overcomes the problems of the prior art by providing a synchronization circuit capable of recognizing the operating mode expected of it, that is, to tell the master mode from the slave mode.

According to one aspect of the invention, a synchronization circuit is provided including the following elements. A bi-directional terminal is provided for receiving an external synchronization signal in a first operating mode and transmitting an internal synchronization signal in a second operating mode. The synchronization circuit further includes an internal synchronization generator to provide the internal synchronization signal, and a comparator block, coupled to receive the internal and to receive the external and to compare the internal synchronization signal to the external synchronization signal. In response to the comparison, the comparator provides an output to the bi-directional terminal indicative of whether the synchronization circuit is operating in the second operating mode.

According to another aspect of the invention, a method of generating and supplying a synchronization signal includes the following steps. Providing a synchronization circuit, the synchronization circuit including a bi-directional terminal for receiving an external synchronization signal in a first operating mode and transmitting an internal synchronization signal in a second operating mode, and forwarding the internal synchronization signal to an output of the bi-directional terminal in response to a comparison of the external synchronization signal against the internal synchronization signal indicating that the synchronization circuit is operating in the second operating mode.

The features and advantages of the circuit and the method of this invention will be apparent from the following description of an embodiment thereof given by way of non-limiting example with reference to the accompanying drawing.

DETAILED DESCRIPTION

Figure 1:
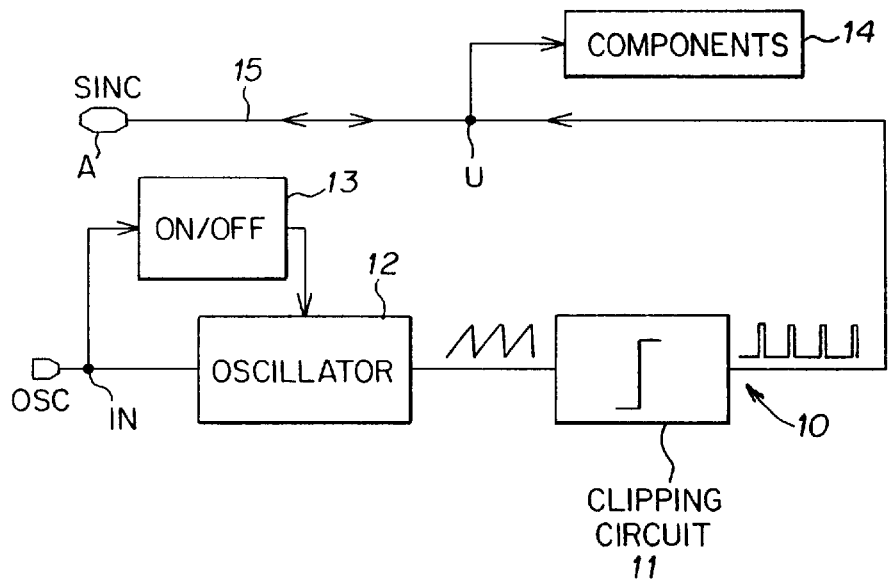
FIG. 1 is a diagram representing schematically a prior art synchronization circuit.
Figure 2:
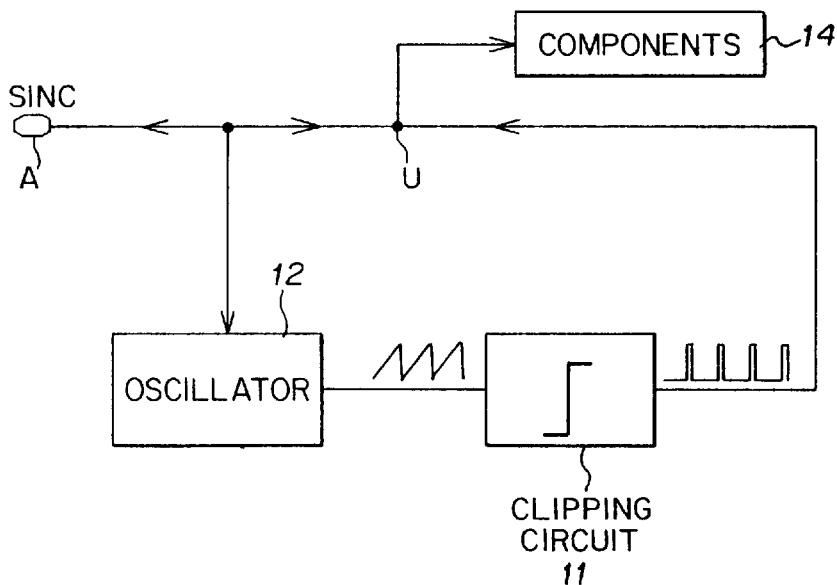
FIG. 2 shows a second embodiment of a synchronization circuit according to the prior art.
Figure 3A:
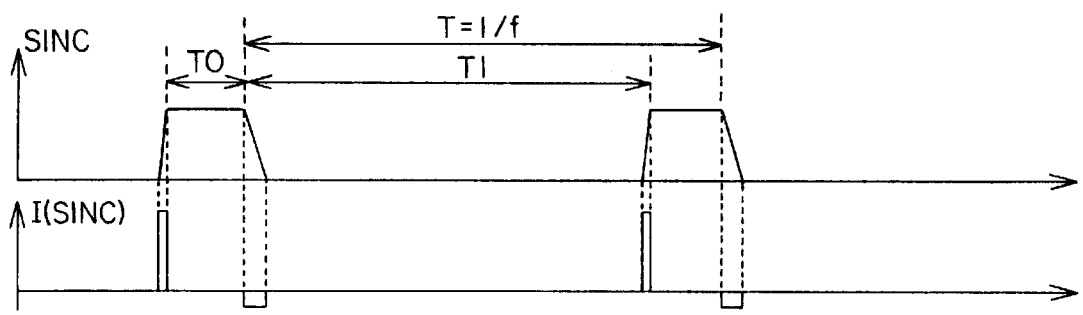
FIGS. 3A and 3B are respective plots versus time of an ideal synchronization signal and a synchronization signal present in the circuit of FIG. 2.
Figure 3B:
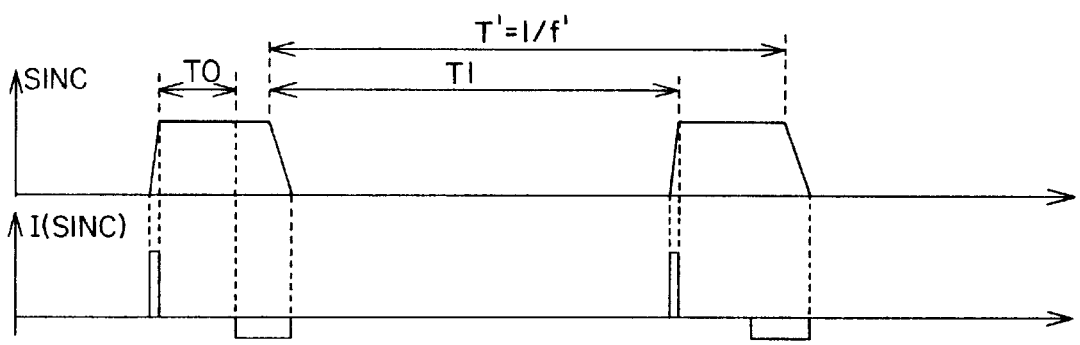
Figure 4:
FIG. 4 is a plot versus time of a synchronization signal as resulting from a malfunction condition of the circuit in FIG. 2.
Figure 5:
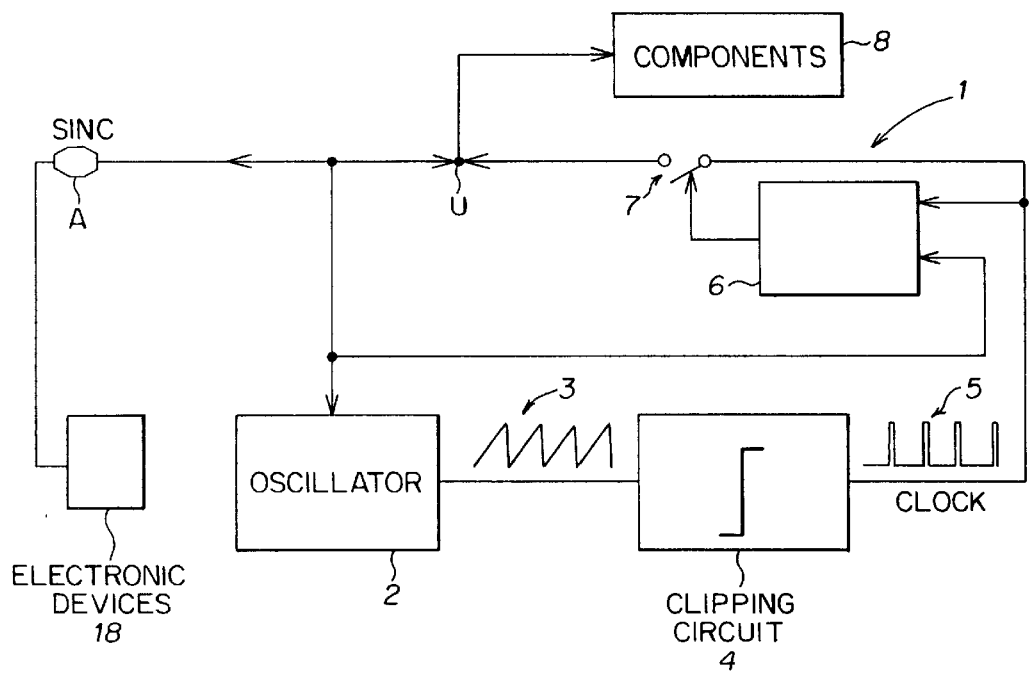
FIG. 5 is a diagram representing schematically a synchronization circuit according to the invention.

Referring now to FIG. 5, generally and schematically shown at 1 is one embodiment of a synchronization circuit according to this invention. The synchronization circuit 1 is shown to include an oscillator 2 which is input a synchronization signal SINC at bi-directional terminal A, and outputs a saw-toothed signal 3. The synchronization signal SINC may be provided either internally, by the circuit 1, or externally by another coupled synchronization circuit (not shown).

The circuit 1 includes a clipping circuit 4 connected to the output of the oscillator 2 to clip the saw-toothed signal 3 and output an internal synchronization signal 5. Accordingly, the clipper 4 can be regarded as a generator of the synchronization signal 5, that is internal to the circuit 1.

According to one embodiment of the invention, the circuit 1 advantageously includes a comparator block 6 which receives both the internal synchronization signal 5 and the external synchronization signal SINC.

The output from the block 6 is active for closing a normally open switch 7. This switch 7 is included in the electric connection between the output of the clipper 4 and a circuit node U which is substantially coincident with the output of the synchronization circuit 1.

The output U is connected to circuit components, generally designated 8, inside the circuit 1. But the output U is also substantially coincident with the terminal A whereto various electronic devices 18 are connected which act as slaves tied operatively to the synchronization signal presented at the node U when the circuit 1 is operated in the master mode.

The invention proposes essentially a method of distributing the synchronization signal, which method can be implemented using the synchronization circuit described above. In fact, the circuit 1 determines when the external synchronization signal SINC has arrived and compares it with the internal synchronization signal 5. In this way, reflections of the signal are avoided and additionally the time base of the synchronization pulse, the operation frequency of the downstream circuits and the system consumption will be unaltered.

The determination as to when the external synchronization signal has arrived is achieved by a comparison of the external synchronization signal SINC to the internal synchronization signal 5. When the circuit 1 is to be operated in the slave mode, the oscillator 2 is forced to discharge by the external synchronization signal SINC from another master. In this case, the output of the clipper 4 changes over after the arrival of the external synchronization signal SINC.

The comparator block 6 is effective to control the two synchronization signals SINC and 5, and only enables the node U charging if the changeover of the clipper 4 output has occurred ahead of the external synchronization signal SINC.

Figure 6:
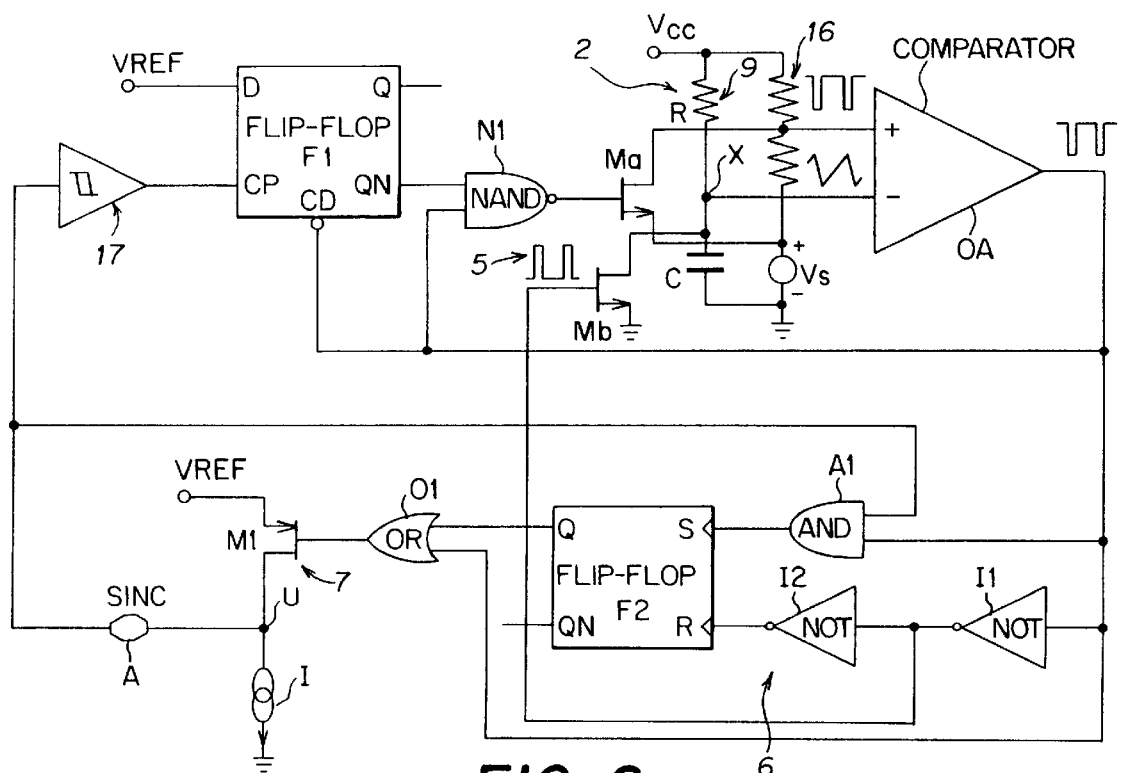
FIG. 6 is a more detailed diagram of the synchronization circuit in FIG. 5.

Shown in greater detail in FIG. 6 is an example construction of the synchronization circuit according to one embodiment of the invention. The example of FIG. 6 is based on a synchronization circuit activated by the leading edge of the signal SINC and upon a saw-toothed signal 5 being generated by the charging of an R-C circuit associated with the oscillator 2.

This RC circuit is designated as 9 in FIG. 6 and connected between a supply voltage reference Vcc and a signal ground. The point of interconnection of the resistor R and the capacitor C is a circuit node X which is connected directly to the inverting input of a comparator OA.

The non-inverting input of the comparator OA is connected to a resistive divider 16 connected between the voltage reference Vcc and a voltage generator Vs which represents the lower threshold of the comparator OA.

The output of the comparator OA is connected to one input of a logic NAND gate N1 having the other input connected to the negated output QN of a storage element F1 of a D type flip-flop. An input CD of this element F1 receives the signal presented at the output of the comparator OA.

The output of the NAND gate N1 is connected to the control terminal of an NMOS transistor Ma which has its drain terminal connected to the resistive divider 16 and its source terminal connected to the voltage generator Vs.

The output of the comparator OA is further connected to one input of a two-input logic AND gate A1, one input of a two-input logic OR gate O1, and an inverter I1. The other input of the gate A1 receives the synchronization signal SINC presented at the terminal A. The output of the gate A1 is connected to a set input S of a storage element of the SR type designated F2. The output Q of this element F2 is connected to the other input of the logic gate O1.

The output of the inverter I1 is connected to a second inverter I2 and to the control terminal of an NMOS transistor Mb having its drain terminal connected to the node X and its source terminal to ground.

The second inverter I2 has an output connected directly to the reset input R of the storage element F2. The output of the logic gate O1 is connected to the control terminal of a transistor M1 of the PMOS type which has its drain terminal connected to the terminal A and its source terminal held at a reference voltage Vref.

A current generator I is connected between the terminal A and ground. The construction of the circuit in FIG. 6 is completed by a Schmitt trigger 17 whose input is applied the synchronization signal SINC and whose output is connected to one input CP of the flip-flop F1. The voltage Vref is also present at the other input D of the flip-flop F1.

The operation of the circuit shown in FIG. 6 and its correspondence to the components shown schematically in FIG. 5 will now be described. The storage element F2 is a dominant set flip-flop responsive to the leading edges of the signals S and R. The P-channel transistor M1 is effective to output the synchronization signal and, accordingly, this transistor is an equivalent of the controlled switch 7. The transistor M1 is in the "on" state when its gate voltage is low. The terminal SINC is discharged through the current generator I.

The logic OR gate O1 transmits the turn-on signal to M1 when both its inputs are low. The flip-flop F1 outputs the negated signal from the Schmitt trigger 17 only when the signal CD is at a high logic level. This can only occur if the synchronization signal SINC precedes the output from the comparator OA, thereby forcing the threshold to change and, consequently, the discharge of the saw-toothed synchronization signal 5.

Under these conditions, until the comparator OA has time to change over its output, the AND gate A1 has two inputs high, so that the output Q of the flip-flop F2 will be forced to a high logic level, thereby holding M1 in the "off" state even when the other input of O1 goes low.

The output Q of F2 only goes to a low logic level upon the output of the comparator OA becoming high again. In this way, turning on M1 when the circuit 1 is operating in the slave mode, and sending the synchronization signal to the master, can be avoided. On the other hand, when operating in the master mode, the setting of the flip-flop F2 will occur subsequently to the changeover of the comparator OA, so that two signals at low logic values are presented at the input of O1 which will turn on M1. In this situation, the above circuit will send a synchronization pulse SINC to the terminal A.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only, and it is not intended as limiting. The invention's limit is defined only in the following claims and the equivalents thereto.

What is claimed is:

1. A synchronization circuit comprising:
    a bi-directional terminal, for receiving an external synchronization signal in a first operating mode and transmitting an internal synchronization signal in a second operating mode;
    an internal synchronization generator to provide the internal synchronization signal;
    a comparator, coupled to receive the internal synchronization signal and to receive the external synchronization signal, the comparator comparing the internal synchronization signal to the external synchronization signal and providing an output to the bi-directional terminal indicative of the whether the synchronization circuit is operating in the second operating mode.

2. The synchronization circuit according to claim 1, wherein the internal synchronization generator further comprises:
    an oscillator, coupled to the bi-directional terminal;
    a clipper, coupled to the oscillator, wherein the output of the clipper provides the internal synchronization signal.

3. The synchronization circuit according to claim 1, further comprising:
    a switch, disposed between the internal synchronization generator and the bi-directional terminal, wherein the comparator selectively provides the internal synchronization signal as the output of the bi-directional terminal through control of the switch.

4. The synchronization circuit according to claim 3, wherein the switch is a PMOS transistor.

5. The synchronization circuit according to claim 1, wherein the comparator block further comprises a logic network comprising a plurality of logic gates and at least one storage element.

6. The synchronization circuit according to claim 1, wherein the determination that the synchronization circuit is operating in the second operating mode is made in response to a relative receipt of the internal synchronization signal and the external synchronization signal at the comparator block.

7. A method of generating and supplying a synchronization signal which comprises the steps of:
    providing a synchronization circuit, the synchronization circuit including a bi-directional terminal for receiving an external synchronization signal in a first operating mode and transmitting an internal synchronization signal in a second operating mode; and
    forwarding the internal synchronization signal to an output of the bi-directional terminal in response to a comparison of the external synchronization signal against the internal synchronization signal indicating that the synchronization circuit is operating in a second operating mode.

8. The method according to claim 7, wherein the indication that the synchronization circuit is operating in the second operating mode is made in response to a relative receipt of the internal synchronization signal and the external synchronization signal at a comparator unit of the synchronization circuit.

9. The method according to claim 7, wherein the step of forwarding the internal synchronization signal further includes the steps of:
    disposing a switch between the internal synchronization signal and the bi-directional terminal; and
    enabling the switch to forward the internal synchronization signal to the bi-directional terminal in response to the indication that the synchronization circuit is operating in the second mode.

10. The method according to claim 9 further including the step of generating the internal synchronization signal, the step of generating the internal synchronization signal further comprising the steps of:

coupling an oscillator to the bi-directional terminal, the oscillator providing a saw tooth signal; and coupling a clipper to the oscillator to clip the saw tooth signal to provide the internal synchronization signal.

11. The method according to claim 10, wherein the oscillator discharges when the synchronization circuit operates in the second mode, causing the internal synchronization signal to be received relatively later at the comparator unit than the external synchronization signal.

12. The method according to claim 10, wherein the switch is enabled when the internal synchronization signal provided by the clipper is received at the comparator unit relatively earlier than the external signal.

13. A synchronization circuit comprising:

a bi-directional terminal, for receiving an external synchronization signal in a first operating mode and transmitting an internal synchronization signal in a second operating mode;

an internal synchronization generator to provide the internal synchronization signal;

a switch, disposed between the internal synchronization generator and the bi-directional terminal;

a comparator block, coupled to receive the internal synchronization signal and to receive the external synchronization signal, the comparator block for selectively providing an output to control the switch, wherein the switch is engaged to allow the internal synchronization generator to forward the internal synchronization signal to the bi-directional terminal when the internal synchronization signal is received relatively later at the comparator than the external synchronization signal.

14. The synchronization circuit according to claim 13, wherein the first mode is a slave mode, wherein the synchronization circuit receives the external synchronization signal at the bi-directional terminal.

15. The synchronization circuit according to claim 13, wherein the second mode is a master mode, wherein the synchronization circuit forwards the internal synchronization signal to the bi-directional terminal.

16. The synchronization circuit according to claim 13, wherein the switch is a PMOS transistor, and wherein the output from the comparator block is coupled to the gate of the PMOS transistor.

17. The synchronization circuit according to claim 13, wherein the internal synchronization generator further comprises:

an oscillator, coupled to the bi-directional terminal;

a clipper, coupled to the oscillator, wherein the output of the clipper provides the internal synchronization signal.

18. The synchronization circuit according to claim 16, wherein oscillator is discharged in response to a receipt of the external synchronization signal at the bi-directional terminal.

19. A synchronization circuit comprising:

a bi-directional terminal, for receiving an external synchronization signal in a first operating mode and transmitting an internal synchronization signal in a second operating mode;

means for generating the internal synchronization signal;

a switch, disposed between the means for generating the internal synchronization signal and the bi-directional terminal;

means, coupled to receive the internal synchronization signal and to receive the external synchronization signal for comparing the internal synchronization signal and the external synchronization signal and for selectively providing an output to control the switch, the output indicative of whether the synchronization circuit is operating in the second operating mode, the output for selectively forwarding the internal synchronization signal to the bi-directional terminal when it is determined that the synchronization signal is operating in the second mode.

* * * * *

UNITED STATES PATENT AND TRADEMARK OFFICE
CERTIFICATE OF CORRECTION

PATENT NO. : 5,982,209
DATED : November 9, 1999
INVENTOR(S) : Antonio Maguzzu' and Bruno Ferrario It is certified that error appears in the above-identified patent and that said Letters Patent is hereby corrected as shown below:

Column 3, line 11 should read:

receive the internal synchronization signal and to receive the external synchronization signal and to Column 4, line 44 should read:

signal SICN and upon a saw-toothed signal 3 being gener-

Column 5, line 41 should read:

zation signal 3.

Signed and Sealed this

Twenty-third Day of May, 2000

*Attest:*

Q. TODD DICKINSON

*Attesting Officer*      *Director of Patents and Trademarks*